(12) United States Patent
Azadet et al.

(10) Patent No.: US 8,982,992 B2
(45) Date of Patent: Mar. 17, 2015

(54) BLOCK-BASED CREST FACTOR REDUCTION (CFR)

(71) Applicant: LSI Corporation, Milpitas, CA (US)

(72) Inventors: Kameran Azadet, Pasadena, CA (US); Albert Molina, Novelda (ES); Joseph H. Othmer, Ocean, NJ (US); Meng-Lin Yu, Morganville, NJ (US); Ramon Sanchez Perez, Galapagar (ES)

(73) Assignee: LSI Corporation, Milpitas, CA (US)

( * ) Notice: Subject to any disclaimer, the term of this patent is extended or adjusted under 35 U.S.C. 154(b) by 32 days.

(21) Appl. No.: 13/701,415

(22) PCT Filed: Oct. 26, 2012

(86) PCT No.: PCT/US2012/062195
§ 371 (c)(1),
(2) Date: Apr. 22, 2013

(87) PCT Pub. No.: WO2013/063450
PCT Pub. Date: May 2, 2013

(65) Prior Publication Data
US 2014/0072073 A1   Mar. 13, 2014

Related U.S. Application Data

(60) Provisional application No. 61/552,242, filed on Oct. 27, 2011.

(51) Int. Cl.
| | |
|---|---|
| H04L 25/49 | (2006.01) |
| G06F 5/01 | (2006.01) |
| H04B 1/04 | (2006.01) |
| H04L 1/00 | (2006.01) |
| H04L 27/233 | (2006.01) |
| H04B 1/62 | (2006.01) |
| G06F 9/30 | (2006.01) |
| H04L 25/02 | (2006.01) |
| H04L 25/03 | (2006.01) |
| H03M 3/00 | (2006.01) |

(52) U.S. Cl.
CPC ............... *G06F 5/01* (2013.01); *H04B 1/0475* (2013.01); *H04L 1/0054* (2013.01); *H04L 27/2334* (2013.01); *H04B 1/62* (2013.01); *G06F 9/3001* (2013.01); *H04L 25/02* (2013.01); *H04L 25/03178* (2013.01); *H03M 3/30* (2013.01)
USPC ......................................................... 375/296

(58) Field of Classification Search
CPC .............. H04L 27/2614; H04L 1/0041; H04L 25/03828; H04L 27/2623; H04L 27/2617; H04B 1/62
USPC ............... 375/295, 296; 455/91, 114.2, 114.3
See application file for complete search history.

(56) References Cited

U.S. PATENT DOCUMENTS

| | | | |
|---|---|---|---|
| 2004/0180679 A1* | 9/2004 | Porter | 455/502 |
| 2008/0187057 A1* | 8/2008 | Qu | 375/260 |
| 2008/0192860 A1* | 8/2008 | Harwood et al. | 375/296 |
| 2009/0029664 A1 | 1/2009 | Batruni | |
| 2010/0098139 A1 | 4/2010 | Braithwaite | |
| 2010/0246714 A1 | 9/2010 | Yang et al. | |
| 2011/0059710 A1 | 3/2011 | Cai et al. | |
| 2012/0093209 A1* | 4/2012 | Schmidt et al. | 375/224 |

* cited by examiner

*Primary Examiner* — Vineeta Panwalkar
(74) *Attorney, Agent, or Firm* — Daniel J. Santos; Smith Risley Tempel Santos LLC

(57) ABSTRACT

Block-based crest factor reduction (CFR) techniques are provided. An exemplary block-based crest factor reduction method comprises obtaining a block of data samples comprised of a plurality of samples; applying the block of data to a crest factor reduction block; and providing a processed block of data from the crest factor reduction block. The block-based crest factor reduction method can optionally be iteratively performed a plurality of times for the block of data. The block of data samples can comprise an expanded block having at least one cursor block. For example, at least two pre-cursor blocks and one post-cursor block can be employed. The peaks can be cancelled, for example, only in the block of data samples and in a first of the pre-cursor blocks.

22 Claims, 6 Drawing Sheets

BLOCK-BASED CREST FACTOR REDUCTION (CFR)

CROSS-REFERENCE TO RELATED APPLICATIONS

The present application claims priority to U.S. Patent Provisional Application Ser. No. 61/552,242, filed Oct. 27, 2011, entitled "Software Digital Front End (SoftDFE) Signal Processing and Digital Radio," incorporated by reference herein.

The present application is related to U.S. patent application Ser. No. 13/661,295 entitled "Crest Factor Reduction (CFR) Using Asymmetrical Pulses;" now U.S. Pat. No. 8,897,388 and U.S. patent application Ser. No. 13/661,351, entitled "Multi-Stage Crest Factor Reduction (CFR) for Multi-Channel Multi-Standard Radio," each filed contemporaneously herewith and incorporated by reference herein.

FIELD OF THE INVENTION

The present invention is related to digital signal processing techniques and, more particularly, to techniques for Crest Factor Reduction.

BACKGROUND OF THE INVENTION

The crest factor or peak-to-average ratio (PAR) is a measurement of a waveform, calculated from the peak amplitude of the waveform divided by the RMS value of the waveform. In many wireless communication technologies, the communication signals often have a high peak-to-average ratio (PAR) that can impair the efficiency of the power amplifiers (PAs) employed in wireless base stations. A number of techniques have been proposed or suggested for reducing the PAR in order to improve the efficiency of the power amplifier to thereby allow a higher average power to he transmitted before saturation occurs.

Crest Factor Reduction (CFR) is a digital technique used to reduce the PAR of the transmitted wireless signals. In a wireless transmitter, for example, the CFR is often incorporated with digital pre-distortion (DPD). The DPD serves to linearize the power amplifier to improve the efficiency of the power amplifier. CFR is often used in conjunction with DPD to maximize the transmit average power for a given power amplifier saturation voltage. Frequently, the CFR is positioned after a digital up conversion (DUC) stage and before DPD and/or equalization.

Generally, Crest Factor Reduction techniques employ peak detection and then peak cancellation by subtracting a cancellation pulse from the detected peaks, to reduce the peak amplitude and thereby reduce the PAR. The cancellation pulse is carefully designed to match the signal/channel spectral response. In this manner, peak cancellation only introduces noise inside the signal channel(s), Existing Crest Factor Reduction techniques process the signal sample-by-sample. In sample-based Crest Factor Reduction software implementations, the overhead introduced with processing each sample in software impairs efficiency (e.g., overhead associated with the function call). Thus, a need exists for block-based Crest Factor Reduction techniques, where each block is comprised of a plurality of samples.

SUMMARY OF THE INVENTION

Generally, block-based crest factor reduction (CFR) techniques are provided. According to one aspect of the invention, a block-based crest factor reduction method comprises obtaining a block of data samples comprised of a plurality of samples; applying the block of data to a crest factor reduction block; and providing a processed block of data from the crest factor reduction block. The block-based crest factor reduction method can optionally be iteratively performed a plurality of times for the block of data.

In one exemplary embodiment, the block of data samples comprises an expanded block having at least one cursor block. The additional cursor blocks can be dropped before providing the processed block of data from the crest factor reduction block. For example, the at least one cursor block can comprise at least two pre-cursor blocks and one post-cursor block. The peaks can be cancelled, for example, only in the block of data samples and in a first of the pre-cursor blocks.

A more complete understanding of the present invention, as well as further features and advantages of the present invention, will be obtained by reference to the following detailed description and drawings.

DETAILED DESCRIPTION

Figure 1:
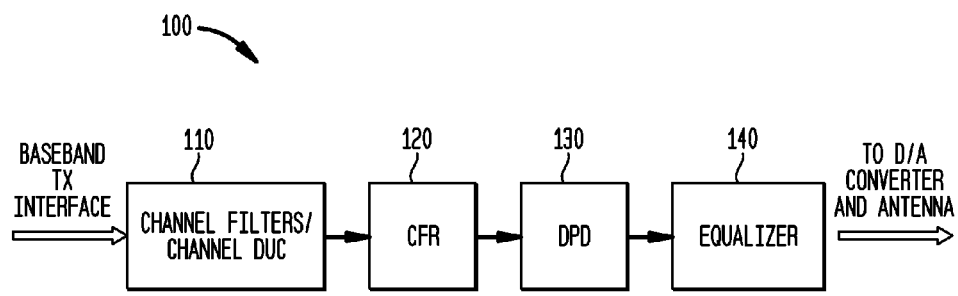
FIG. 1 illustrates portions of an exemplary transmitter in which aspects of the present invention may be employed.

FIG. 1 illustrates portions of an exemplary transmitter 100 in which aspects of the present invention may be employed. As shown in FIG. 1, the exemplary transmitter portion 100 comprises a channel filter and digital up conversion (DUC) stage 110, a crest factor reduction (CFR) stage 120, a digital pre-distortion (DPD) stage 130 and an optional equalization stage 140. Generally, the channel filter and digital up conversion stage 110 performs channel filtering using. for example finite impulse response (FIR) filters and digital up conversion to convert a digitized baseband signal to an. intermediate frequency (IF). As indicated above, the crest factor reduction stage 120 limits the PAR of the transmitted signal. The digital pre-distortion stage 130 linearizes the power amplifier to improve efficiency. The equalization stage 140 employs RF channel equalization to mitigate channel impairments.

One aspect of the present invention recognizes that block-based CFR processing can be performed on blocks of data to improve efficiency. For example, a vector engine (VE) can be employed to perform CFR on blocks of data. According to another aspect of the present invention, to ensure continuity of processing between blocks of data, pre-cursor and post-cursor block samples are employed. As discussed further below, the pre-cursor and post-cursor blocks avoid edge effects that would otherwise be caused by block processing.

The present invention can be applied in handsets, base stations and other network elements.

Figure 2:
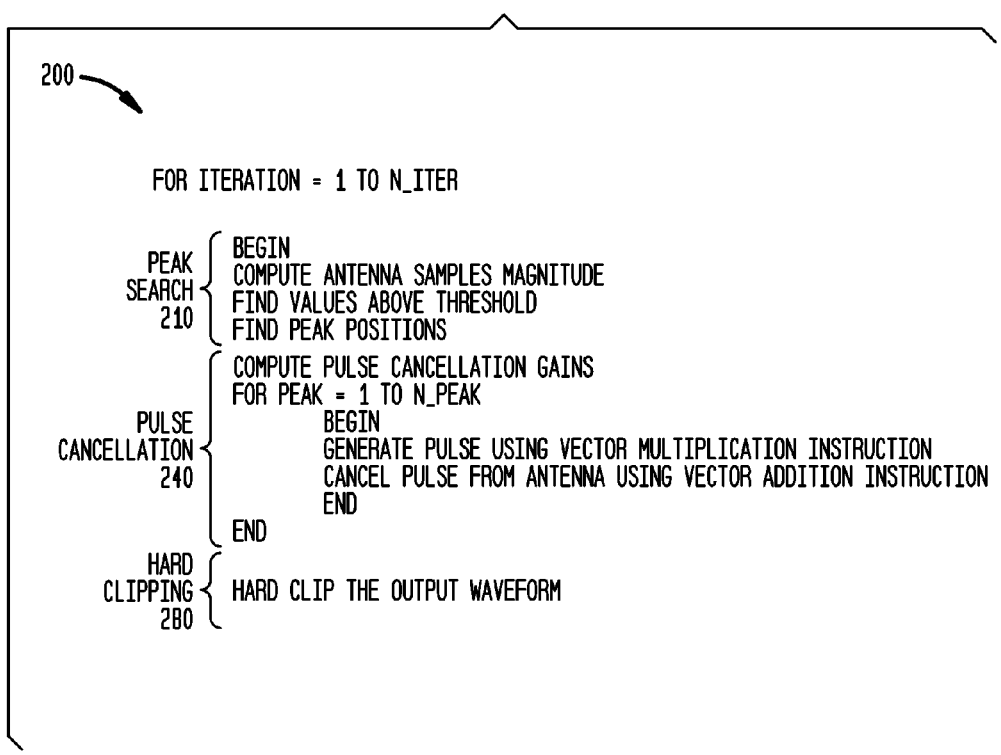
FIG. 2 illustrates exemplary pseudo code for a software implementation of block-based Crest Factor Reduction in accordance with the present invention.

FIG. 2 illustrates exemplary pseudo code for a suitable Crest Factor Reduction algorithm 200. It is noted that any alternative Crest Factor Reduction algorithm could also be employed. As shown in FIG. 2, the exemplary Crest Factor Reduction algorithm 200 comprises three parts, namely a peak search phase 210, a pulse cancellation phase 240 and a hard clipping phase 280. The exemplary Crest Factor Reduction algorithm 200 can be implemented in hardware or in software.

The exemplary Crest Factor Reduction algorithm 200 can optionally be performed iteratively to address peak regrowth. For example, a number of iterations, N_iter, can have a typical value between 1 and 4. Generally, peak regrowth results when new peaks are introduced when canceling other peaks, due to the ringing on both side of the puke (the pulse is traditionally designed as a linear phase symmetrical FIR filter with a plurality of taps). There are taps on both sides of the center tap. Thus, peaks can be introduced in current or past sample values. In order to address the peaks introduced in past samples, existing CFR algorithms requires multiple iterations to cancel all peaks.

During the peak search phase 210, a search is conducted through the signal to determine the number of peaks, their locations and the magnitudes above the threshold level. The exemplary Crest Factor Reduction algorithm 200 initially computes the antenna samples magnitude. The sample values above a threshold are then identified. For example, the threshold can be established based on the PAR target. Thereafter, the peak positions can be identified, for example, using a max( ) instruction.

During the pulse cancellation phase 240, the cancellation pulses are arranged at each of the peaks, then all the pulses are subtracted from the peaks. The exemplary Crest Factor Reduction algorithm 200 computes the pulse cancellation gains (e.g., threshold divided by the magnitude of the detected peaks). Thereafter, the exemplary Crest Factor Reduction algorithm 200 enters a loop to separately process each peak. For each peak, a pulse is generated, for example, using a vector multiplication instruction, and then the pulse is cancelled from the antenna, for example, using a vector addition instruction.

During the hard clipping phase 280, the exemplary Crest Factor Reduction algorithm 200 hard clips the output waveform, for example, using non-linear operations for modulus inverse. The clipping threshold level R is set based on the PAR target. The hard clipping may be performed, for example, using a polar clipping technique. Generally, polar clipping involves computing |x|, comparing |x| to a threshold R and scaling by R/|x|. If |x| is greater than R, x is replaced by R.

In a further variation, crest factor reduction can be performed in the frequency domain.

As indicated above, one aspect of the present invention recognizes that CFR processing can be performed on blocks of data to improve efficiency. For example, a vector engine (VE) can be employed to perform CFR on blocks of data. In a software implementation, block processing improves efficiency by amortizing the overhead over an entire block 350 of data and not just individual data samples 310.

Figure 3:
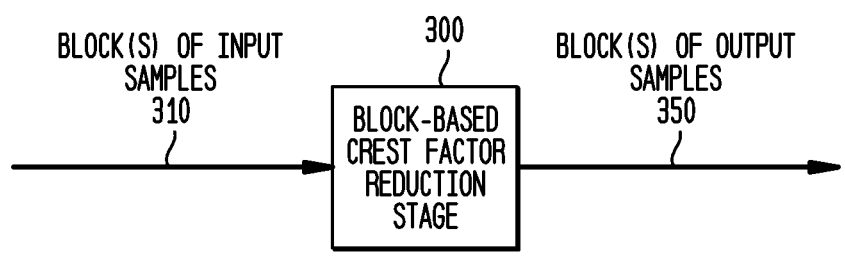
FIG. 3 illustrates a block-based Crest Factor Reduction stage that performs CFR on blocks of data.

FIG. 3 illustrates a block-based Crest Factor Reduction stage 300 that performs CFR on blocks of data. As shown in FIG. 3, one or more blocks 310 of input samples are applied to the block-based Crest Factor Reduction stage 300. As used herein, a block of input samples 310 comprises a set of N consecutive samples. The block-based Crest Factor Reduction stage 300 generates one or more output blocks 350 of output samples.

Figure 4:
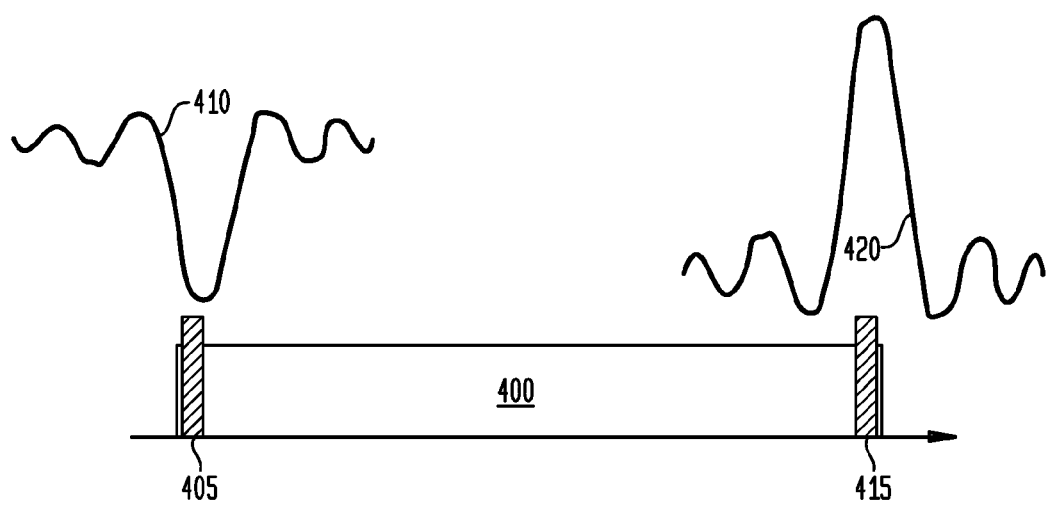
FIG. 4 illustrates block processing Crest Factor Reduction in accordance with an embodiment of the invention.

FIG. 4 illustrates block processing Crest Factor Reduction in accordance with an embodiment of the invention. As shown in FIG. 4, a block of data 400 can be applied to the Crest Factor Reduction algorithm 200 of FIG. 2. If a peak, such as peaks 405, 415, are detected near the edge of the block 400, however, there will be edge effects when the taps of the corresponding cancellation pulse 410, 420 extend outside of the block of data 400.

Figure 5:
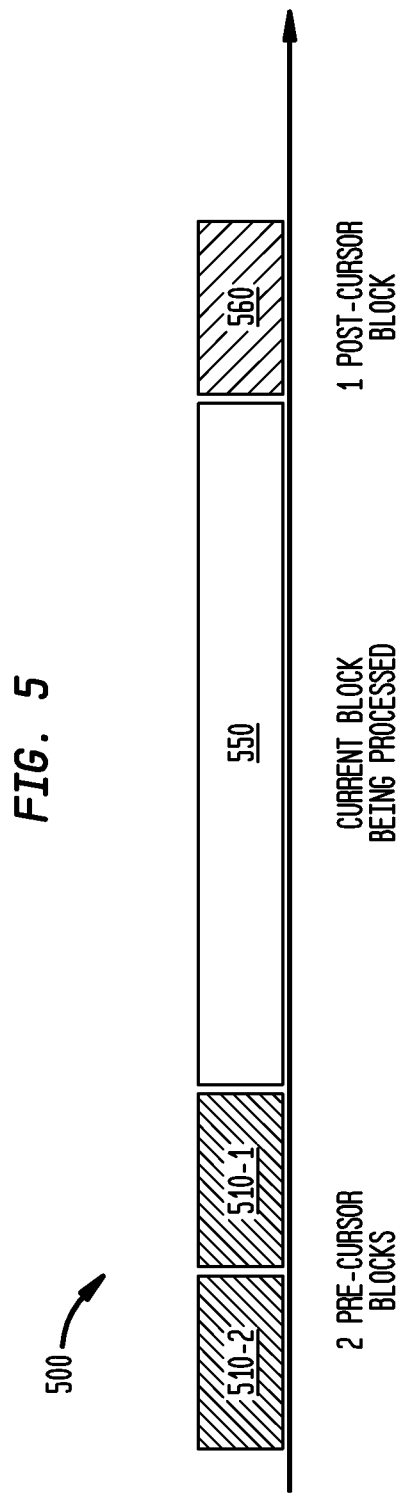
FIG. 5 illustrates block processing Crest Factor Reduction in accordance with a further embodiment of the invention.

Thus, according to another aspect of the invention, continuity of processing between blocks of data is ensured using one or more pre-cursor and/or post-cursor block samples. FIG. 5 illustrates block processing 500 for Crest Factor Reduction in accordance with an embodiment of the invention. As shown in the exemplary embodiment of FIG. 5, before being applied to the exemplary Crest Factor Reduction algorithm 200 of FIG. 2, two pre-cursors 510-1, 510-2 are placed in front of a current block 550 being processed and a single post-cursor block 560 is appended at the end of the current block 550. In this manner, the beginning and end of block 550 can be processed without introducing edge effects that would otherwise be caused by the block processing.

In one exemplary embodiment, the size of each cursor block 510, 560 is selected to be approximately equal to the size of half of a cancellation pulse 410, 420. In addition, to maintain an appropriate amount of overhead, the size of each data block 500 should be considerably larger than the size of each cursor block 510, 560. Generally, the larger the size of each data block 500, the larger the required memory and the higher the latency.

The pre-cursor blocks 510 are populated with input data from the end of the prior data block and the post-cursor block 560 is populated with input data from the beginning of subsequent data block.

In one exemplary embodiment, peaks are detected and canceled in the block 550 and in the first pre-cursor block 510-1, and not in the post-cursor block 560 because post-cursor data will be processed during the processing of the next block. The post-cursor input samples associated with the post-cursor block 560 are only need to cancel peaks inside the block 550.

In addition, when canceling a peak at the left edge of the block 550, peak re-growth occurs in the first pre-cursor block 510-1. Thus, in order to cancel these new peaks in the first pre-cursor block 510-1, the second pre-cursor block 510-2 is needed (but no cancellation is performed in the second pre-cursor block 510-2).

Figure 6:
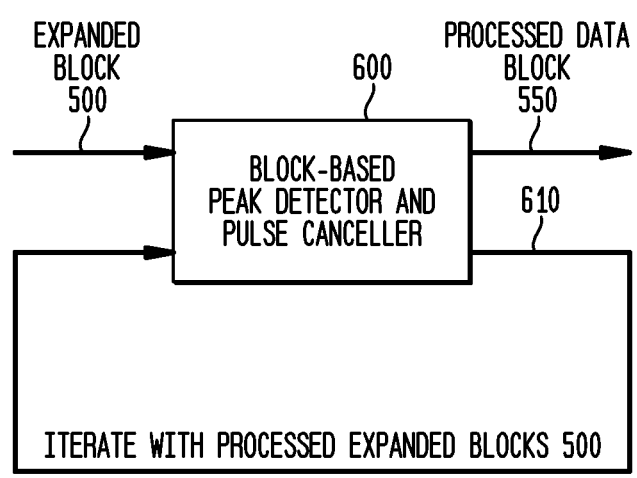
FIG. 6 illustrates an exemplary block-based peak detector and pulse canceller for a hardware implementation of Crest Factor Reduction.

FIG. 6 illustrates an exemplary block-based peak detector and pulse canceller 600 for a hardware implementation of Crest Factor Reduction. The block-based peak detector and pulse canceller 600 can be used for one or more iterations for a given data block 550. As shown in FIG. 6, an expanded version 500 of the given data block 550 is applied to the block-based peak detector and pulse canceller 600. The expanded version 500 of the given data block 550 is comprised of data block 550, pre-cursor blocks 510 and post-cursor block 560. The block-based peak detector and pulse canceller 600 can optionally iterate with the processed expanded version 500 using a feedback path 610. After the final iteration a corresponding processed block of data corresponding to block 550 is output from the block-based peak detector and pulse canceller 600 (i.e., the cursor blocks 510, 560 are dropped from the output and only the processed version of the data block 550 remains).

Conclusion

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A block-based crest factor reduction method, comprising:
   obtaining a block of data samples comprised of a plurality of samples;
   identifying an expanded block having at least one cursor block, the at least one cursor block including at least two pre-cursor blocks and a post-cursor block;
   applying said expanded block of data to a crest factor reduction block; and
   providing a processed block of data from said crest factor reduction block, the processed block of data excluding the expanded block of data while including modifications to the block of data samples that result from crest factor reduction adjustments in the block of data samples and crest factor reduction adjustments in a first of the at least two pre-cursor blocks.

2. The method of claim 1, wherein said crest factor reduction block comprises a processor implementing a crest factor reduction algorithm using software instructions.

3. The method of claim 1, wherein said crest factor reduction block comprises one or more peak detector and pulse cancellers.

4. The method of claim 1, wherein said method is iteratively performed a plurality of times for said block of data.

5. The method of claim 1, wherein said crest factor reduction adjustments include a pulse cancellation performed by a vector multiplication and a vector addition.

6. The method of claim 1, further comprising the step of clipping the processed block of data.

7. The method of claim 1, wherein a size of the at least one cursor block is approximately half of a cancellation pulse.

8. The method of claim 1, wherein peaks are cancelled in said block of data samples and in the first of said pre-cursor blocks and not in the post-cursor block.

9. A digital signal processor configured to perform block-based Crest Factor Reduction comprising:
   a memory; and
   at least one hardware device, coupled to the memory, operative to:
   obtain a block of data samples comprised of a plurality of samples;
   identify an expanded block having at least one cursor block, the at least one cursor block including at least two pre-cursor blocks and a post-cursor block;
   apply said expanded block of data to a crest factor reduction algorithm; and
   provide a processed block of data from said crest factor reduction algorithm, the processed block of data excluding the expanded block of data while including modifications to the block of data samples therein that result from adjustments in the block of data samples and adjustments in a first of the at least two pre-cursor blocks.

10. The digital signal processor of claim 9, wherein said at least one hardware device implements said crest factor reduction algorithm using software instructions.

11. The digital signal processor of claim 9, wherein said crest factor reduction algorithm employs one or more peak detector and pulse cancellers.

12. The digital signal processor of claim 9, wherein said method is iteratively performed a plurality of times for said block of data.

13. The digital signal processor of claim 9, wherein said adjustments include a pulse cancellation performed by a vector multiplication and a vector addition.

14. The digital signal processor of claim 9, wherein said at least one hardware device is further configured to clip said processed block of data.

15. The digital signal processor of claim 9, wherein a size of said at least one cursor block is approximately half of a cancellation pulse.

16. The digital signal processor of claim 9, wherein peaks are cancelled in said block of data samples and in the first of said pre-cursor blocks and no peaks are cancelled in the post-cursor block.

17. A block-based crest factor reduction block, comprising:
   an input port to receive a block of data samples comprised of a plurality of samples;
   a block-based peak detector and pulse canceller arranged to receive the bock of data samples and to perform said block-based crest factor reduction, the block-based peak detector and pulse canceller responsive to an expanded block having at least one cursor block, the at least one cursor block including at least two pre-cursor blocks and a post-cursor block; and
   an output port to provide a processed block of data, wherein the processed block of data includes modifications in the block of data samples that result from adjustments in the block of data samples and adjustments in a first of the at least two pre-cursor blocks while excluding the at least one cursor block.

18. The block-based crest factor reduction block of claim 17, wherein said block-based crest factor reduction is iteratively performed a plurality of times for said block of data.

19. The block-based crest factor reduction block of claim 17, wherein said adjustments include a pulse cancellation performed by a vector multiplication and a vector addition.

20. The block-based crest factor reduction block of claim 17, wherein said adjustments include clipping data samples in the processed block of data.

21. The block-based crest factor reduction block of claim 17, wherein a size of the said at least one cursor block is approximately half of a cancellation pulse.

22. The block-based crest factor reduction block of claim 17, wherein peaks are not cancelled in the post-cursor block and are cancelled in said block of data samples and in the first of said pre-cursor blocks.

* * * * *